(12) United States Patent
Camacho et al.

(10) Patent No.: US 7,750,451 B2
(45) Date of Patent: Jul. 6, 2010

(54) MULTI-CHIP PACKAGE SYSTEM WITH MULTIPLE SUBSTRATES

(75) Inventors: Zigmund Ramirez Camacho, Singapore (SG); Henry Descalzo Bathan, Singapore (SG); Lionel Chien Hui Tay, Singapore (SG); Arnel Trasporto, Singapore (SG)

(73) Assignee: Stats Chippac Ltd., Singapore (SG)

( * ) Notice: Subject to any disclaimer, the term of this patent is extended or adjusted under 35 U.S.C. 154(b) by 625 days.

(21) Appl. No.: 11/672,164

(22) Filed: Feb. 7, 2007

(65) Prior Publication Data
US 2008/0185702 A1    Aug. 7, 2008

(51) Int. Cl.
H01L 23/02    (2006.01)

(52) U.S. Cl. ............... 257/686; 257/E23.079; 257/E23.169; 257/692; 257/777; 257/723; 257/789; 257/788; 257/790; 257/796; 257/684; 257/666; 257/784; 257/786; 257/685

(58) Field of Classification Search .......... 257/686, 257/685, E23.169, 723, 777, 684, 796, E23.079, 257/788, 789, 790, 784, 786, 666, 692
See application file for complete search history.

(56) References Cited

U.S. PATENT DOCUMENTS

| | | | |
|---|---|---|---|
| 6,906,415 B2 | 6/2005 | Jiang et al. | |
| 6,936,929 B1* | 8/2005 | Mostafazadeh et al. | 257/778 |
| 6,958,544 B2 | 10/2005 | Sunohara | |
| 7,071,547 B2 | 7/2006 | Kang et al. | |
| 7,112,048 B2 | 9/2006 | Lim et al. | |
| 7,161,239 B2 | 1/2007 | Zhao et al. | |
| 7,208,826 B2* | 4/2007 | Sakamoto et al. | 257/687 |
| 7,531,383 B2* | 5/2009 | Lo et al. | 438/109 |
| 2001/0001740 A1* | 5/2001 | Miyawaki | 438/700 |
| 2005/0230799 A1* | 10/2005 | Kang | 257/684 |
| 2007/0145580 A1* | 6/2007 | Satou et al. | 257/723 |
| 2009/0051019 A1* | 2/2009 | Huang et al. | 257/676 |

* cited by examiner

Primary Examiner—Alexander O Williams
(74) Attorney, Agent, or Firm—Mikio Ishimaru

(57) ABSTRACT

A multi-chip package system is provided including providing a first carrier having a first integrated circuit die thereover, providing a second carrier, placing the first carrier coplanar with the second carrier, and molding a package encapsulation around and exposing the first carrier.

20 Claims, 8 Drawing Sheets

MULTI-CHIP PACKAGE SYSTEM WITH MULTIPLE SUBSTRATES

TECHNICAL FIELD

The present invention relates generally to multi-chip package system, and more particularly to a multi-chip package system having multiple rows of leads.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large scale IC ("LSI") packages that are incorporated into these devices are required to be made smaller and thinner, and the package configurations that house and protect them are required to be made smaller and thinner as well.

The electronics industry is increasing the semiconductor chip density (the number of chips mounted on a single circuit board or no-lead leadframe) that parallels the reduction in the number of components that are needed for a circuit. This results in packaging designs that are more compact, in form factors (the physical size and shape of a device) that are more compact, and in a significant increase in overall IC density.

To condense further the packaging of individual devices, packages have been developed in which more than one device can be packaged at one time at each package site. Each package site is a structure that provides mechanical support for the individual IC devices. It also provides one or more layers of interconnect lines that enable the devices to be connected electrically to surrounding circuitry. Of importance to complicated packaging designs are considerations of input/output count, heat dissipation, matching of thermal expansion between a motherboard and its attached components, cost of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC chip that incorporates all the same functions. Current multi-chip modules typically consist of a substrate onto which a set of separate IC chip components is directly attached onto the single substrate. Such multi-chip modules have been found to increase circuit density and miniaturization, improve signal propagation speed, reduce overall device size and weight, improve performance, and lower costs—all primary goals of the computer industry.

However, such multi-chip modules can be bulky. IC package density is determined by the area required to mount a die or module on a circuit board. One method for reducing the board size of multi-chip modules and thereby increase their effective density is to stack the die or chips vertically within the module or package.

However, current multi-chip modules can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process problems including yield.

In addition, current multi-chip modules may require structures which increase complexity that are needed to route signals, power, and ground to the various integrated circuits in the module. For example, the substrate may require additional routing layers, separate stacking interposers, or complex redistribution structures. Also, as multiple integrated circuits are stacked or mounted side by side on a substrate, it is increasingly difficult to ensure prior to assembly of the multiple integrated circuits thereby risking increased cost if any of the integrated circuit fails.

Thus, a need still remains for a multi-chip package system providing low cost manufacturing, improved yield, higher pin count, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a multi-chip package system including providing a first carrier having a first integrated circuit die thereover, providing a second carrier, placing the first carrier coplanar with the second carrier, and molding a package encapsulation around and exposing the first carrier.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
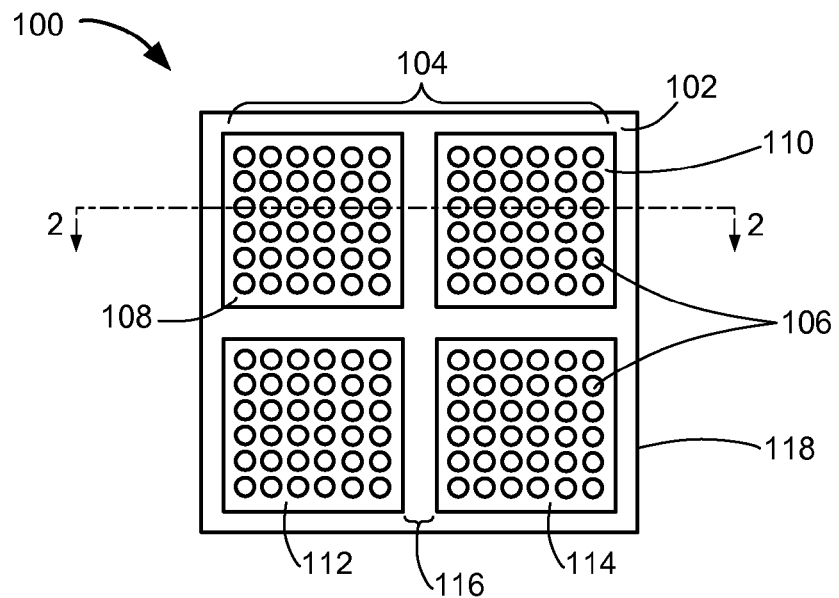
FIG. 1 is a bottom view of a multi-chip package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of a multi-chip package system 100 in a first embodiment of the present invention. The bottom view depicts a package encapsulation 102, such as a cover including epoxy mold compound, around carriers 104, such as substrates. The package encapsulation 102 exposes the carriers 104 and terminals 106, such as terminal pads, of the carriers 104 for further connections.

The carriers 104 include a first carrier 108, a second carrier 110, a third carrier 112, and a fourth carrier 114. The package encapsulation 102 is around and between the first carrier 108, the second carrier 110, the third carrier 112, and the fourth carrier 114. The terminals 106 are exposed from the first carrier 108, the second carrier 110, the third carrier 112, and the fourth carrier 114.

For illustrative purposes, the first carrier 108, the second carrier 110, the third carrier 112, and the fourth carrier 114 are shown substantially the same, although it is understood that the first carrier 108, the second carrier 110, the third carrier 112, and the fourth carrier 114 may be different, such as different types, sizes, or number of the terminals 106. Also for illustrative purposes, spaces 116 between the carriers 104 are shown substantially the same, although it is understood that the spaces 116 between the carriers 104 may be different. Further for illustrative purposes, the package encapsulation 102 forms a package outline 118 of the multi-chip package system 100, although it is understood that the package encapsulation 102 may not form the package outline 118, such as not surrounding all the carriers 104.

Figure 2:
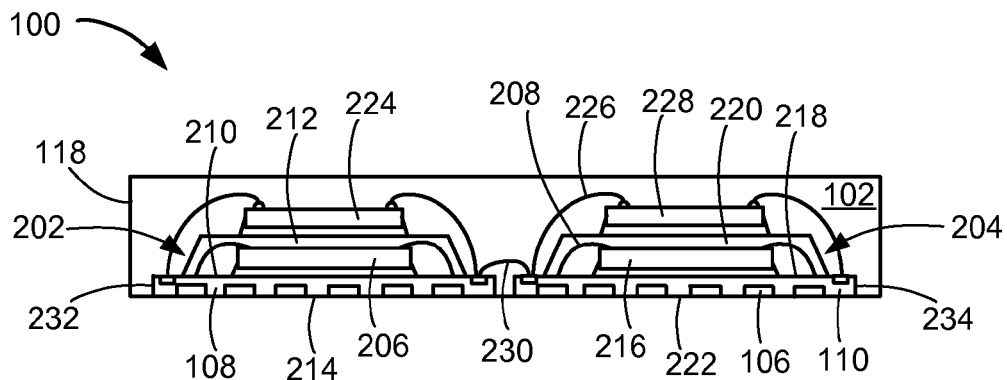
FIG. 2 is a cross-sectional view of the multi-chip package system along a line 2-2 of FIG. 1 in the first embodiment of the present invention.

Referring now to FIG. 2, therein is shown a cross-sectional view of the multi-chip package system 100 along a line 2-2 of FIG. 1 in the first embodiment of the present invention. The cross-sectional view depicts the multi-chip package system 100 as a stacked integrated circuit package-in-package system with a first integrated circuit package system 202 having the first carrier 108 and a second integrated circuit package system 204 having the second carrier 110. The first carrier 108 and the second carrier 110 are coplanar with the terminals 106 of the first carrier 108 and the second carrier 110 exposed for further connections. The third carrier 112 of FIG. 1 and the fourth carrier 114 of FIG. 1 are also coplanar with each other and with the first carrier 108 and the second carrier 110.

The first integrated circuit package system 202 includes a first integrated circuit die 206 over the first carrier 108. First interconnects 208, such as bond wires, are between the first integrated circuit die 206 and a first non-exposed side 210 of the first carrier 108. A first encapsulation 212, such as a cover including epoxy mold compound, is over the first integrated circuit die 206 attached or mounted to the first non-exposed side 210 and the first interconnects 208. A first exposed side 214 of the first carrier 108 exposes the terminals 106 allowing external connections with the first integrated circuit die 206 through the first carrier 108 and the first interconnects 208 without requiring an additional or different connection structure.

The second integrated circuit package system 204 includes a second integrated circuit die 216 over the second carrier 110. The first interconnects 208 are between the second integrated circuit die 216 and a second non-exposed side 218 of the second carrier 110. A second encapsulation 220, such as a cover including epoxy mold compound, is over the second integrated circuit die 216 and the first interconnects 208. A second exposed side 222 of the second carrier 110 exposes the terminals 106 allowing external connections with the second integrated circuit die 216 through the second carrier 110 and the first interconnects 208 without requiring an additional or different connection structure.

For illustrative purposes, the first integrated circuit die 206 is shown as a wire bond integrated circuit, although it is understood that the first integrated circuit die 206 may not be a wire bond integrated circuit, such as a flip chip. Also for illustrative purposes, the second integrated circuit die 216 is shown as a wire bond integrated circuit, although it is understood that the second integrated circuit die 216 may not be a wire bond integrated circuit, such as a flip chip.

A first device 224, such as an integrated circuit die or an integrated circuit package system, is over the first integrated circuit package system 202. Second interconnects 226, such as bond wires, connect the first device 224 and the first non-exposed side 210 of the first carrier 108. The terminals 106 exposed at the first exposed side 214 allow external connections with the first device 224 through the first carrier 108 and the second interconnects 226 without requiring an additional or different connection structure.

A second device 228, such as an integrated circuit die or an integrated circuit package system, is over the second integrated circuit package system 204. The second interconnects 226 connect the second device 228 and the second non-exposed side 218 of the second carrier 110. The terminals 106 exposed at the second exposed side 222 allow external connections with the second device 228 through the second carrier 110 and the second interconnects 226 without requiring an additional or different connection structure.

The multi-chip package system 100 also includes third interconnects 230, such as bond wires, connect the first carrier 108 and the second carrier 110. The package encapsulation 102 covers the first integrated circuit package system 202, the second integrated circuit package system 204, the first device 224, the second device 228, the second interconnects 226, and the third interconnects 230 exposing the first exposed side 214 and the second exposed side 222.

The package encapsulation 102 forms the package outline 118 along the sides of the multi-chip package system 100 covering first edges 232 of the first carrier 108 and second edges 234 of the second carrier 110.

The co-planarity between the first carrier 108 and the second carrier 110 provides more connections for the multi-chip package system 100. The co-planarity enables a thinner profile of the multi-chip package system 100. Signal integrity to the first integrated circuit die 206, the second integrated circuit die 216, the first device 224, and the second device 228 improves by eliminating other connection structures, such as interposers.

The first integrated circuit package system 202 and the second integrated circuit package system 204 may be tested without assembly of the multi-chip package system 100. This ensures known good devices (KGD) of the first integrated circuit package system 202 and the second integrated circuit package system 204 increasing the yield of the multi-chip package system 100.

Figure 3:
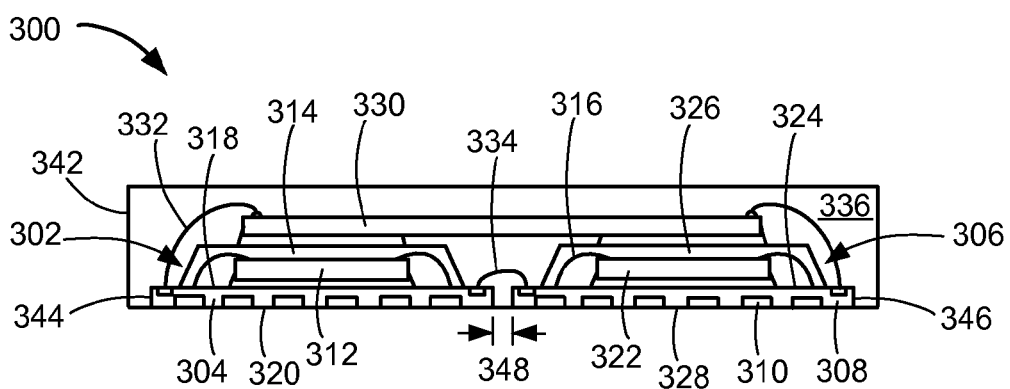
FIG. 3 is a cross-sectional view of the multi-chip package system along a line 2-2 of FIG. 1 in a second embodiment of the present invention.

Referring now to FIG. 3, therein is shown a cross-sectional view of a multi-chip package system 300 along a line 2-2 of FIG. 1 in a second embodiment of the present invention. The bottom view of the multi-chip package system 100 of FIG. 1 also represents the bottom view of the multi-chip package system 300.

The cross-sectional view depicts the multi-chip package system 300 as a stacked integrated circuit package-in-package system with a first integrated circuit package system 302 having a first carrier 304 and a second integrated circuit package system 306 having a second carrier 308. The first carrier 304 and the second carrier 308 may be similar to the first carrier 108 of FIG. 1 and the second carrier 110 of FIG. 1, respectively. The first carrier 304 and the second carrier 308 are coplanar with terminals 310, such as terminal pads, of the first carrier 304 and the second carrier 308 exposed for further connections.

The first integrated circuit package system 302 includes a first integrated circuit die 312 over the first carrier 304. First interconnects 316, such as bond wires, are between the first integrated circuit die 312 and a first non-exposed side 318 of the first carrier 304. A first encapsulation 314, such as a cover including epoxy mold compound, is over the first integrated circuit die 312 and the first interconnects 316. A first exposed side 320 of the first carrier 304 exposes the terminals 310 allowing external connections with the first integrated circuit die 312 through the first carrier 304 and the first interconnects 316 without requiring an additional or different connection structure.

The second integrated circuit package system 306 includes a second integrated circuit die 322 over the second carrier 308. The first interconnects 316 are between the second integrated circuit die 322 and a second non-exposed side 324 of the second carrier 308. A second encapsulation 326, such as a cover including epoxy mold compound, is over the second integrated circuit die 322 and the first interconnects 316. A second exposed side 328 of the second carrier 308 exposes the terminals 310 allowing external connections with the second integrated circuit die 322 through the second carrier 308 and the first interconnects 316 without requiring an additional or different connection structure.

For illustrative purposes, the first integrated circuit die 312 is shown as a wire bond integrated circuit, although it is understood that the first integrated circuit die 312 may not be a wire bond integrated circuit, such as a flip chip. Also for illustrative purposes, the second integrated circuit die 322 is shown as a wire bond integrated circuit, although it is understood that the second integrated circuit die 322 may not be a wire bond integrated circuit, such as a flip chip.

A device 330, such as an integrated circuit die or an integrated circuit package system, is over the first integrated circuit package system 302 and the second integrated circuit package system 306. Second interconnects 332, such as bond wires, connect the device 330 with the first non-exposed side 318 and the second non-exposed side 324. The terminals 310 exposed at the first exposed side 320 and at the second exposed side 328 allow external connections with the device 330 through the first carrier 304, the second carrier 308, and the second interconnects 332 without requiring an additional or different connection structure. The device 330 may also function as a bridging device between the first integrated circuit package system 302 and the second integrated circuit package system 306.

The multi-chip package system 300 also includes third interconnects 334, such as bond wires, connect the first carrier 304 and the second carrier 308. A package encapsulation 336, such as a cover including epoxy mold compound, covers the first integrated circuit package system 302, the second integrated circuit package system 306, the device 330, the second interconnects 332, and the third interconnects 334 exposing the first exposed side 320 and the second exposed side 328.

The package encapsulation 336 forms a package outline 342 along the sides of the multi-chip package system 300 covering first edges 344 of the first carrier 304 and second edges 346 of the second carrier 308. The package encapsulation 336 fills a space 348 between the first carrier 304 and the second carrier 308.

The co-planarity between the first carrier 304 and the second carrier 308 provides more connections for the multi-chip package system 300. The co-planarity enables a thinner profile of the multi-chip package system 300. Signal integrity to the first integrated circuit die 312, the second integrated circuit die 322, and the device 330 improves by eliminating other connection structures, such as interposers.

The first integrated circuit package system 302 and the second integrated circuit package system 306 may be tested without assembly of the multi-chip package system 300. This ensures known good devices (KGD) of the first integrated circuit package system 302 and the second integrated circuit package system 306 increasing the yield of the multi-chip package system 300.

Figure 4:
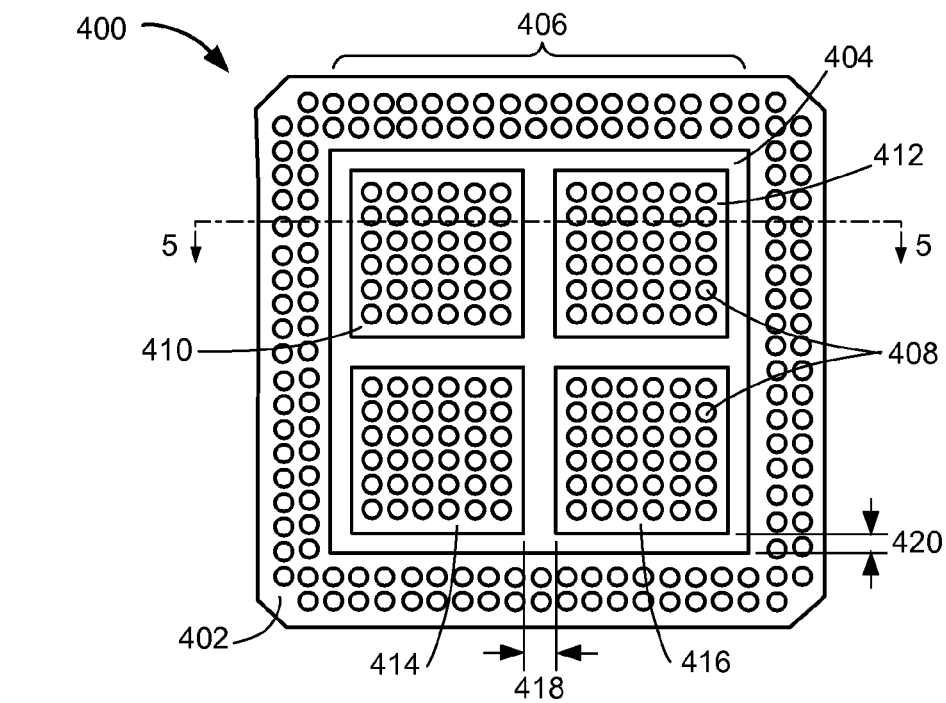
FIG. 4 is a bottom view of a multi-chip package system in a third embodiment of the present invention.

Referring now to FIG. 4, therein is shown a bottom view of a multi-chip package system 400 in a third embodiment of the present invention. The bottom view depicts an outer carrier 402, such as a substrate, around a package encapsulation 404, such as a cover including epoxy mold compound. The package encapsulation 404 is around and surrounds inner carriers 406, such as substrates. The package encapsulation 404 exposes the outer carrier 402 and the inner carriers 406. The package encapsulation 404 also exposes terminals 408, such as terminal pads, of the outer carrier 402 and of the inner carriers 406 for further connections.

The inner carriers 406 include a first carrier 410, a second carrier 412, a third carrier 414, and a fourth carrier 416. The package encapsulation 404 is around and between the first carrier 410, the second carrier 412, the third carrier 414, and the fourth carrier 416. The terminals 408 are exposed from the first carrier 410, the second carrier 412, the third carrier 414, and the fourth carrier 416.

For illustrative purposes, the first carrier 410, the second carrier 412, the third carrier 414, and the fourth carrier 416 are shown substantially the same, although it is understood that the first carrier 410, the second carrier 412, the third carrier 414, and the fourth carrier 416 may be different, such as different types, sizes, or number of the terminals 408. Also for illustrative purposes, first spaces 418 between the inner carriers 406 are shown substantially the same, although it is understood that the first spaces 418 between the inner carriers 406 may be different. Further for illustrative purposes, second spaces 420 between each of the inner carriers 406 and the outer carrier 402 are substantially the same, although the second spaces 420 between each of the inner carriers 406 and the outer carrier 402 may be different.

Figure 5:
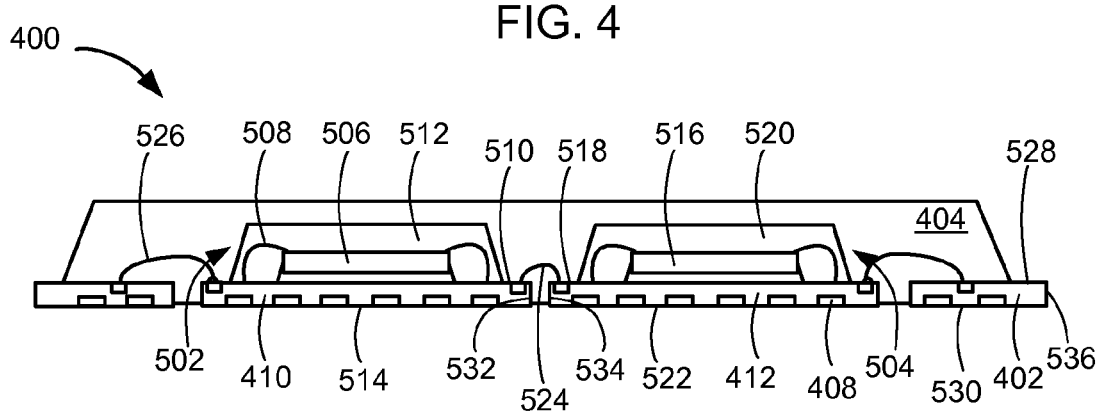
FIG. 5 is a cross-sectional view of the multi-chip package system along a line 5-5 of FIG. 4 in the third embodiment of the present invention.

Referring now to FIG. 5, therein is shown a cross-sectional view of the multi-chip package system 400 along a line 5-5 of FIG. 4 in the third embodiment of the present invention. The cross-sectional view depicts the multi-chip package system 400 as an integrated circuit package-in-package system with a first integrated circuit package system 502 having the first carrier 410 and a second integrated circuit package system 504 having the second carrier 412. The first carrier 410 and the second carrier 412 are between the outer carrier 402. The outer carrier 402, the first carrier 410, the second carrier 412, the third carrier 414 of FIG. 4, and the fourth carrier 416 of FIG. 4 are coplanar with each other. The terminals 408 of the outer carrier 402, the first carrier 410, and the second carrier 412 are exposed for further connections.

The first integrated circuit package system 502 includes a first integrated circuit die 506 over the first carrier 410. First interconnects 508, such as bond wires, are between the first integrated circuit die 506 and a first non-exposed side 510 of the first carrier 410. A first encapsulation 512, such as a cover including epoxy mold compound, is over the first integrated circuit die 506 and the first interconnects 508. A first exposed side 514 of the first carrier 410 exposes the terminals 408 allowing external connections with the first integrated circuit die 506 through the first carrier 410 and the first interconnects 508 without requiring an additional or different connection structure.

The second integrated circuit package system 504 includes a second integrated circuit die 516 over the second carrier 412. The first interconnects 508 are between the second integrated circuit die 516 and a second non-exposed side 518 of the second carrier 412. A second encapsulation 520, such as a cover including epoxy mold compound, is over the second integrated circuit die 516 and the first interconnects 508. A second exposed side 522 of the second carrier 412 exposes the terminals 408 allowing external connections with the second integrated circuit die 516 through the second carrier 412 and the first interconnects 508 without requiring an additional or different connection structure.

For illustrative purposes, the first integrated circuit die 506 is shown as a wire bond integrated circuit, although it is understood that the first integrated circuit die 506 may not be a wire bond integrated circuit, such as a flip chip. Also for illustrative purposes, the second integrated circuit die 516 is shown as a wire bond integrated circuit, although it is understood that the second integrated circuit die 516 may not be a wire bond integrated circuit, such as a flip chip.

The multi-chip package system 400 also includes second interconnects 524, such as bond wires, connect the first carrier 410 and the second carrier 412. Third interconnects 526, such as bond wires, connect the first carrier 410 and the second carrier 412 with an outer non-exposed side 528 of the outer carrier 402. The package encapsulation 404 covers the first integrated circuit package system 502, the second integrated circuit package system 504, the second interconnects 524, and the third interconnects 526. The package encapsulation 404 exposes the first exposed side 514, the second exposed side 522, and an outer exposed side 530 of the outer carrier 402.

The package encapsulation 404 covers first edges 532 of the first carrier 410 and second edges 534 of the second carrier 412. The package encapsulation 404 exposes outer edges 536 of the outer carrier 402.

The co-planarity between the outer carrier 402, the first carrier 410, and the second carrier 412 provides more connections for the multi-chip package system 400. The co-planarity enables a thinner profile of the multi-chip package system 400. Signal integrity to the first integrated circuit die 506 and the second integrated circuit die 516 improves by eliminating other connection structures, such as interposers.

The first integrated circuit package system 502 and the second integrated circuit package system 504 may be tested without assembly of the multi-chip package system 500. This ensures known good devices (KGD) of the first integrated circuit package system 502 and the second integrated circuit package system 504 increasing the yield of the multi-chip package system 500.

Figure 6:
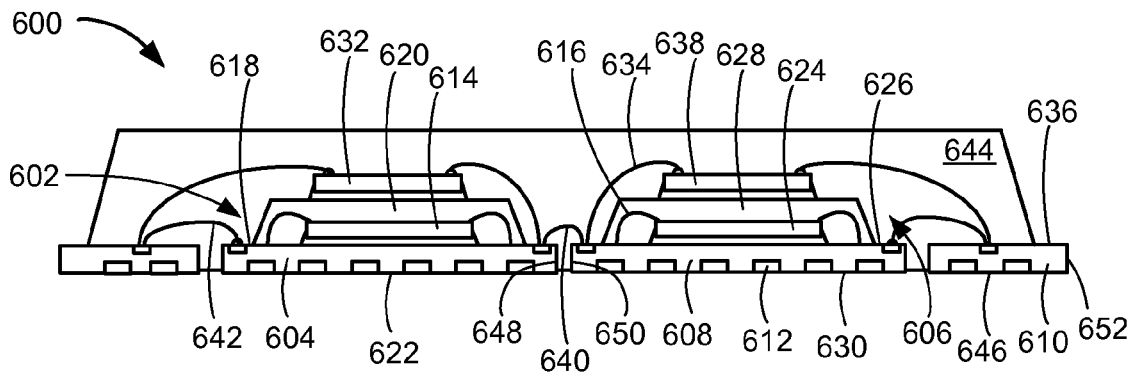
FIG. 6 is a cross-sectional view of a multi-chip package system along a line 5-5 of FIG. 4 in a fourth embodiment of the present invention.

Referring now to FIG. 6, therein is shown a cross-sectional view of a multi-chip package system 600 along a line 5-5 of FIG. 4 in a fourth embodiment of the present invention. The bottom view of FIG. 4 may also represent the bottom view of the multi-chip package system 600. The multi-chip package system 600 has structural similarities with the multi-chip package system 400 of FIG. 5. The cross-sectional view depicts the multi-chip package system 600 as a stacked integrated circuit package-in-package system.

A first integrated circuit package system 602 includes a first carrier 604 and a second integrated circuit package system 606 includes a second carrier 608. The first carrier 604 and the second carrier 608 are between an outer carrier 610. The outer carrier 610, the first carrier 604, and the second carrier 608 are coplanar with each other. Terminals 612 of the outer carrier 610, the first carrier 604, and the second carrier 608 are exposed for further connections.

For brevity, the first integrated circuit package system 602 may be represented by the first integrated circuit package system 502 of FIG. 5. The first integrated circuit package system 602 includes a first integrated circuit die 614 over the first carrier 604. First interconnects 616 are between the first integrated circuit die 614 and a first non-exposed side 618 of the first carrier 604. A first encapsulation 620 is over the first integrated circuit die 614 and the first interconnects 616. A first exposed side 622 of the first carrier 604 exposes the terminals 612.

Also for brevity, the second integrated circuit package system 606 may be represented by the second integrated circuit package system 504 of FIG. 5. The second integrated circuit package system 606 includes a second integrated circuit die 624 over the second carrier 608. The first interconnects 616 are between the second integrated circuit die 624 and a second non-exposed side 626 of the second carrier 608. A second encapsulation 628 is over the second integrated circuit die 624 and the first interconnects 616. A second exposed side 630 of the second carrier 608 exposes the terminals 612.

A first device 632, such as an integrated circuit die or an integrated circuit package system, is over the first integrated circuit package system 602. Second interconnects 634, such as bond wires, connect the first device 632 with the first non-exposed side 618 of the first carrier 604 and an outer non-exposed side 636 of the outer carrier 610. The terminals 612 exposed at the first exposed side 622 allow external connections with the first device 632 through the first carrier 604 and the second interconnects 634 without requiring an additional or different connection structure.

A second device 638, such as an integrated circuit die or an integrated circuit package system, is over the second integrated circuit package system 606. The second interconnects 634 also connect the second device 638 with the second non-exposed side 626 of the second carrier 608 and the outer non-exposed side 636 of the outer carrier 610. The terminals 612 exposed at the second exposed side 630 allow external connections with the second device 638 through the second carrier 608 and the second interconnects 634 without requiring an additional or different connection structure.

The multi-chip package system 600 also includes third interconnects 640, such as bond wires, connect the first carrier 604 and the second carrier 608. Fourth interconnects 642, such as bond wires, connect the first carrier 604 and the second carrier 608 with the outer non-exposed side 636. A package encapsulation 644 covers the first integrated circuit package system 602, the second integrated circuit package system 606, the first device 632, the second device 638, the second interconnects 634, the third interconnects 640, and the fourth interconnects 642. The package encapsulation 644 exposes the first exposed side 622, the second exposed side 630, and an outer exposed side 646 of the outer carrier 610.

The package encapsulation 644 covers first edges 648 of the first carrier 604 and second edges 650 of the second carrier 608. The package encapsulation 644 exposes outer edges 652 of the outer carrier 610.

The co-planarity between the outer carrier 610, the first carrier 604, and the second carrier 608 provides more connections for the multi-chip package system 600. The co-planarity enables a thinner profile of the multi-chip package system 600. Signal integrity to the first integrated circuit die 614, the second integrated circuit die 624, the first device 632, and the second device 638 improves by eliminating other connection structures, such as interposers.

The first integrated circuit package system 602 and the second integrated circuit package system 606 may be tested without assembly of the multi-chip package system 600. This ensures known good devices (KGD) of the first integrated circuit package system 602 and the second integrated circuit package system 606 increasing the yield of the multi-chip package system 600.

Figure 7:
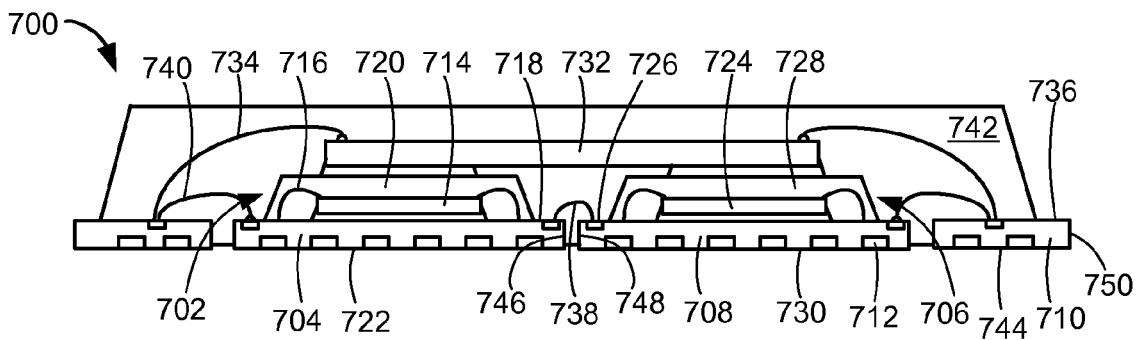
FIG. 7 is a cross-sectional view of a multi-chip package system along a line 5-5 of FIG. 4 in a fifth embodiment of the present invention.

Referring now to FIG. 7, therein is shown a cross-sectional view of a multi-chip package system 700 along a line 5-5 of FIG. 4 in a fifth embodiment of the present invention. The bottom view of FIG. 4 may also represent the bottom view of the multi-chip package system 700. The multi-chip package system 700 has structural similarities with the multi-chip package system 600 of FIG. 6. The cross-sectional view depicts the multi-chip package system 700 as a stacked integrated circuit package-in-package system.

A first integrated circuit package system 702 includes a first carrier 704 and a second integrated circuit package system 706 includes a second carrier 708. The first carrier 704 and the second carrier 708 are between an outer carrier 710. The outer carrier 710, the first carrier 704, and the second carrier 708 are coplanar with each other. Terminals 712 of the outer carrier 710, the first carrier 704, and the second carrier 708 are exposed for further connections.

For brevity, the first integrated circuit package system 702 may be represented by the first integrated circuit package system 502 of FIG. 5. The first integrated circuit package system 702 includes a first integrated circuit die 714 over the first carrier 704. First interconnects 716 are between the first integrated circuit die 714 and a first non-exposed side 718 of the first carrier 704. A first encapsulation 720 is over the first integrated circuit die 714 and the first interconnects 716. A first exposed side 722 of the first carrier 704 exposes the terminals 712.

Also for brevity, the second integrated circuit package system 706 may be represented by the second integrated circuit package system 504 of FIG. 5. The second integrated circuit package system 706 includes a second integrated circuit die 724 over the second carrier 708. The first interconnects 716 are between the second integrated circuit die 724 and a second non-exposed side 726 of the second carrier 708. A second encapsulation 728 is over the second integrated circuit die 724 and the first interconnects 716. A second exposed side 730 of the second carrier 708 exposes the terminals 712.

A device 732, such as an integrated circuit die or an integrated circuit package system, is over the first integrated circuit package system 702 and the second integrated circuit package system 706. Second interconnects 734, such as bond wires, connect the device 732 and an outer non-exposed side 736 of the outer carrier 710. The terminals 712 are exposed at the outer non-exposed side 736 allowing external connections with the device 732 through the outer carrier 710 and the second interconnects 734 without requiring an additional or different connection structure. The device 732 may also function as a bridging device between the first integrated circuit package system 702 and the second integrated circuit package system 706.

The multi-chip package system 700 also includes third interconnects 738, such as bond wires, connect the first carrier 704 and the second carrier 708. Fourth interconnects 740, such as bond wires, connect the first carrier 704 and the second carrier 708 with the outer non-exposed side 736. A package encapsulation 742 covers the first integrated circuit package system 702, the second integrated circuit package system 706, the device 732, the second interconnects 734, the third interconnects 738, and the fourth interconnects 740. The package encapsulation 742 exposes the first exposed side 722, the second exposed side 730, and an outer exposed side 744 of the outer carrier 710.

The package encapsulation 742 covers first edges 746 of the first carrier 704 and second edges 748 of the second carrier 708. The package encapsulation 742 exposes outer edges 750 of the outer carrier 710.

The co-planarity between the outer carrier 710, the first carrier 704, and the second carrier 708 provides more connections for the multi-chip package system 700. The co-planarity enables a thinner profile of the multi-chip package system 700. Signal integrity to the first integrated circuit die 714, the second integrated circuit die 724, and the device 732 improves by eliminating other connection structures, such as interposers.

The first integrated circuit package system 702 and the second integrated circuit package system 706 may be tested without assembly of the multi-chip package system 700. This ensures known good devices (KGD) of the first integrated circuit package system 702 and the second integrated circuit package system 706 increasing the yield of the multi-chip package system 700.

Figure 8:
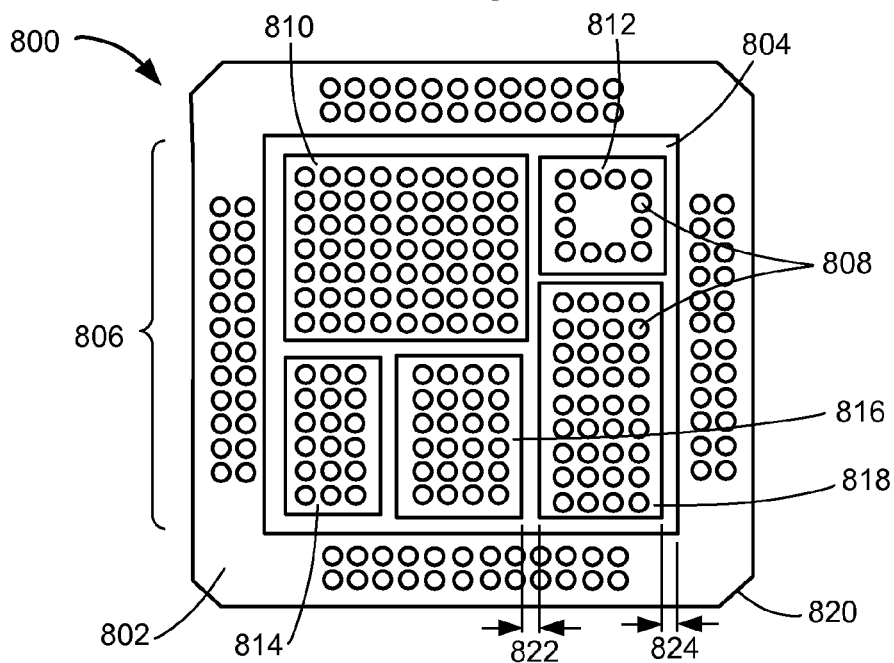
FIG. 8 is a bottom view of a multi-chip package system in a sixth embodiment of the present invention.

Referring now to FIG. 8, therein is shown a bottom view of a multi-chip package system 800 in a sixth embodiment of the present invention. The bottom view depicts an outer carrier 802, such as a substrate, around a package encapsulation 804, such as a cover including epoxy mold compound. The package encapsulation 804 is around and surrounds inner carriers 806, such as substrates, exposing the outer carrier 802 and the inner carriers 806. The package encapsulation 804 also exposes terminals 808, such as terminal pads, of the outer carrier 802 and of the inner carriers 806 for further connections.

The inner carriers 806 include a first carrier 810, a second carrier 812, a third carrier 814, a fourth carrier 816, and a fifth carrier 818. The package encapsulation 804 is around and between the first carrier 810, the second carrier 812, the third carrier 814, the fourth carrier 816, and the fifth carrier 818. The terminals 808 are exposed from the first carrier 810, the second carrier 812, the third carrier 814, the fourth carrier 816, and the fifth carrier 818.

The bottom view depicts that the inner carriers 806 are not substantially the same, such as having different sizes and different configuration for the terminals 808. For example, the second carrier 812 is not the same size as the first carrier 810, the third carrier 814, the fourth carrier 816, and the fifth carrier 818. Also, the second carrier 812 has the terminals 808 in a peripheral configuration whereas the first carrier 810, the third carrier 814, the fourth carrier 816, and the fifth carrier 818 have the terminals 808 in an array configuration. The outer carrier 802 has the terminals 808 not extending to corners 820 of the outer carrier 802.

For illustrative purposes, first spaces 822 between the inner carriers 806 are shown as different, although it is understood that the first spaces 822 between the inner carriers 806 may not be different. Also for illustrative purposes, second spaces 824 between each of the inner carriers 806 and the outer carrier 802 are shown as different, although the second spaces 824 between each of the inner carriers 806 and the outer carrier 802 may not be different.

Figure 9:
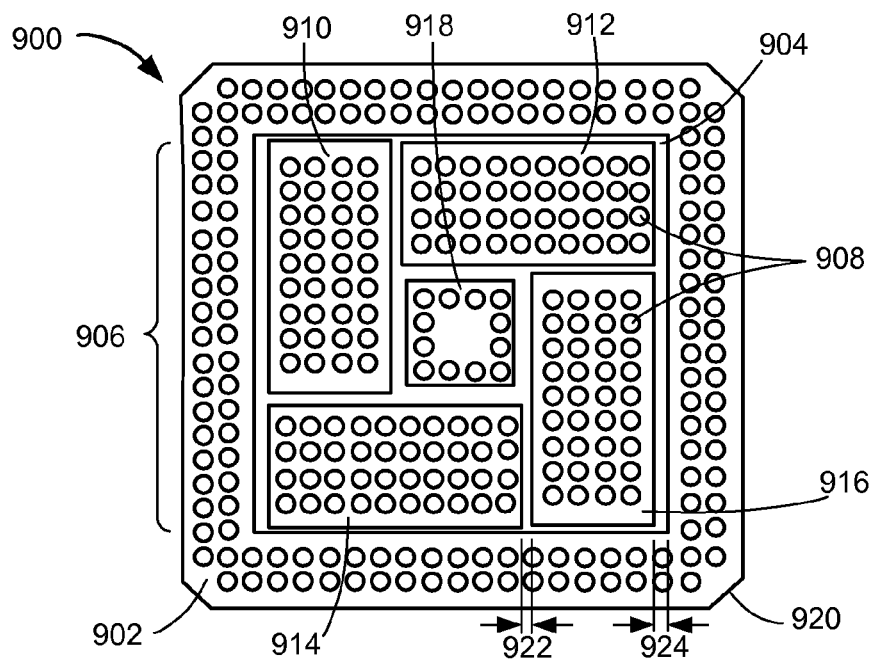
FIG. 9 is a bottom view of a multi-chip package system in a seventh embodiment of the present invention.

Referring now to FIG. 9, therein is shown a bottom view of a multi-chip package system 900 in a seventh embodiment of the present invention. The bottom view depicts an outer carrier 902, such as a substrate, around a package encapsulation 904, such as a cover including epoxy mold compound. The package encapsulation 904 is around and surrounds inner carriers 906, such as substrates, exposing the outer carrier 902 and the inner carriers 906. The package encapsulation 904 also exposes terminals 908, such as terminal pads, of the outer carrier 902 and of the inner carriers 906 for further connections.

The inner carriers 906 include a first carrier 910, a second carrier 912, a third carrier 914, and a fourth carrier 916 surrounding a fifth carrier 918. The first carrier 910, the second carrier 912, the third carrier 914, and the fourth carrier 916 are shown as substantially the same size and having the terminals 908 in an array configuration. The fifth carrier 918 differs from the first carrier 910, the second carrier 912, the third carrier 914, and the fourth carrier 916, wherein the fifth carrier 918 differences includes a different size and having the terminals 908 in a peripheral configuration. The outer carrier 902 has the terminals 908 extending to corners 920 of the outer carrier 902.

The package encapsulation 904 is around and between the first carrier 910, the second carrier 912, the third carrier 914, the fourth carrier 916, and the fifth carrier 918. The terminals 908 are exposed from the first carrier 910, the second carrier 912, the third carrier 914, the fourth carrier 916, and the fifth carrier 918.

For illustrative purposes, first spaces 922 between the inner carriers 906 are shown as different, although it is understood that the first spaces 922 between the inner carriers 906 may not be different. Also for illustrative purposes, second spaces 924 between each of the inner carriers 906 and the outer carrier 902 are shown as different, although the second spaces 924 between each of the inner carriers 906 and the outer carrier 902 may not be different.

Figure 10:
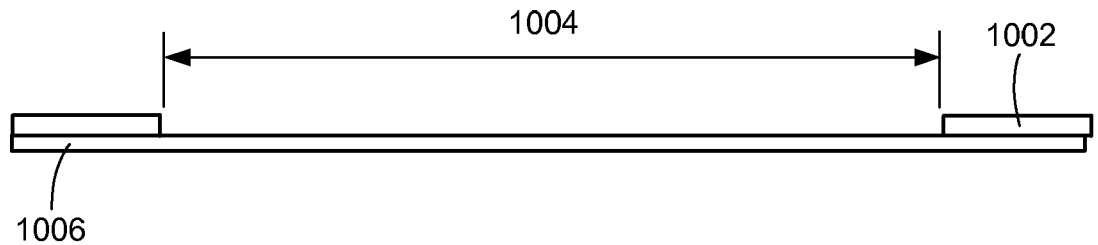
FIG. 10 is a cross-sectional view of the multi-chip package system of FIG. 1 in a phase for mounting a frame.

Referring now to FIG. 10, therein is shown a cross-sectional view of the multi-chip package system 100 of FIG. 1 in a phase for mounting a frame 1002. The frame 1002, such as a metal frame, has a window 1004 and attaches with a tape 1006, such as a coverlay tape. The window 1004 may be in an array configuration throughout the frame 1002. The frame 1002 may serve multiple functions, such as a stiffener or a lead frame. The frame 1002 may provide structural support securing the tape 1006 in a planar configuration.

Figure 11:
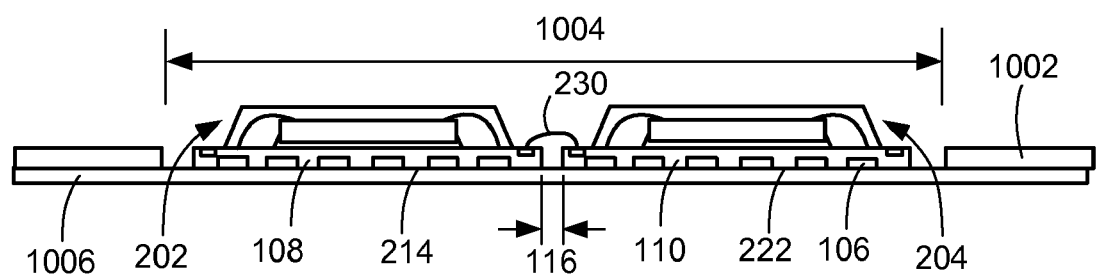
FIG. 11 is the structure of FIG. 10 in a phase for mounting the first integrated circuit package system and the second integrated circuit package system.

Referring now to FIG. 11, therein is shown the structure of FIG. 10 in a phase for mounting the first integrated circuit package system 202 and the second integrated circuit package system 204. The first integrated circuit package system 202 and the second integrated circuit package system 204 are mounted within the window 1004 of the frame 1002 and on the tape 1006. The first exposed side 214 and the second exposed side 222 attach to the tape 1006 covering the terminals 106 from further processing. The tape 1006 provides the planar rigidity such that the first exposed side 214 and the second exposed side 222 are coplanar. The first integrated circuit package system 202 and the second integrated circuit package system 204 are adjacent to each other with one of the spaces 116 in between. The third interconnects 230 connect the first carrier 108 and the second carrier 110.

Figure 12:
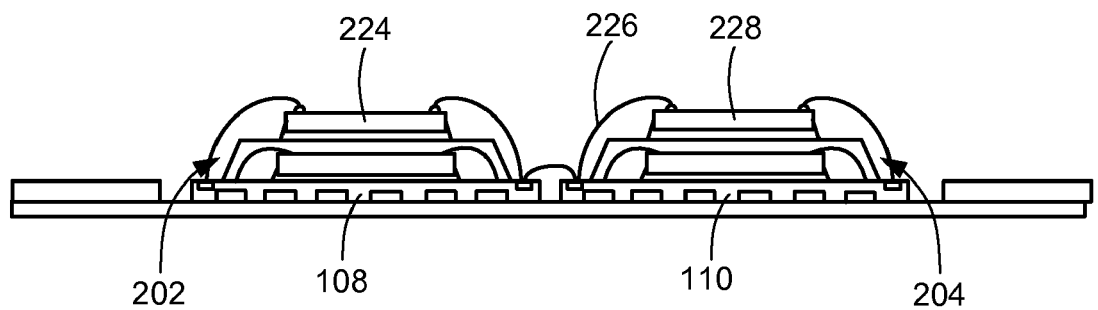
FIG. 12 is the structure of FIG. 1 in a phase for mounting the first device and the second device.

Referring now to FIG. 12, therein is shown the structure of FIG. 11 in a phase for mounting the first device 224 and the second device 228. The first device 224 mounts over the first integrated circuit package system 202. The second device 228 mounts over the second integrated circuit package system 204. The second interconnects 226 connect the first device 224 and the first carrier 108 as well as connect the second device 228 and the second carrier 110.

Figure 13:
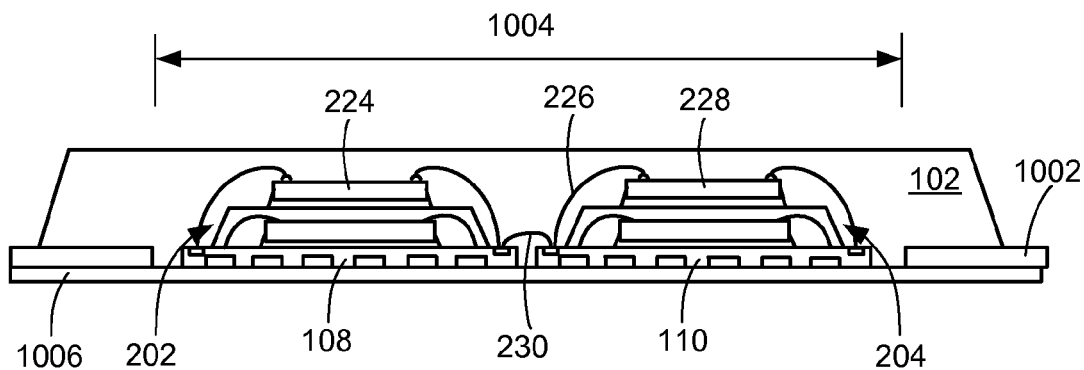
FIG. 13 is the structure of FIG. 12 in a phase for forming the package encapsulation.

Referring now to FIG. 13, therein is shown the structure of FIG. 12 in a phase for forming the package encapsulation 102. The package encapsulation 102 is formed covering a portion of the frame 1002 and filling the window 1004. The package encapsulation 102 covers the first integrated circuit package system 202, the second integrated circuit package system 204, the second interconnects 226, the first device 224, the second device 228, and the third interconnects 230. The tape 1006 provides a planar surface such that the package encapsulation 102 in the window 1004 is coplanar with the first carrier 108 and the second carrier 110.

Figure 14:
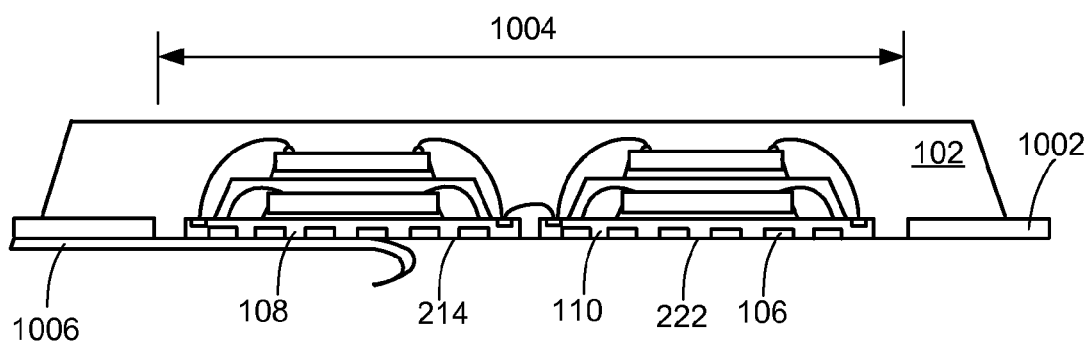
FIG. 14 is the structure of FIG. 13 in a phase for removing the tape.

Referring now to FIG. 14, therein is shown the structure of FIG. 13 in a phase for removing the tape 1006. The package encapsulation 102 may undergo post mold cure. The tape 1006 is removed from the frame 1002 exposing the package encapsulation 102 in the window 1004. The terminals 106, the first carrier 108, and the second carrier 110 are exposed. A surface of the package encapsulation 102 in the window 1004, the first exposed side 214, and the second exposed side 222 are coplanar.

Figure 15:
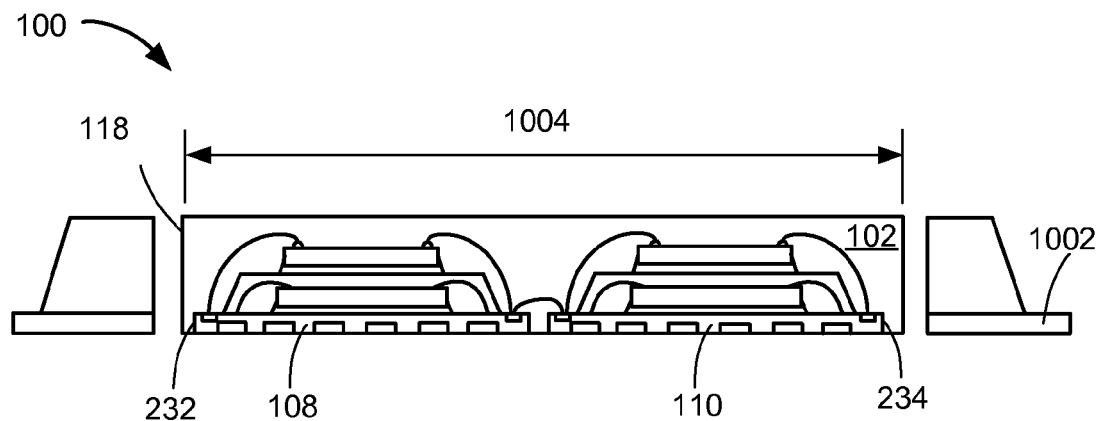
FIG. 15 is the structure of FIG. 14 in phase for forming the multi-chip package system.

Referring now to FIG. 15, therein is shown the structure of FIG. 14 in phase for forming the multi-chip package system 100. The multi-chip package system 100 may undergo end of line processing, such as laser marking or solder ball attaching. The multi-chip package system 100 is singulated from the frame 1002 with the singulation is through the package encapsulation 102 within the window 1004. The package encapsulation 102 forms the package outline 118 along the sides of the multi-chip package system 100 covering the first edges 232 of the first carrier 108 and the second edges 234 of the second carrier 110.

Figure 16:
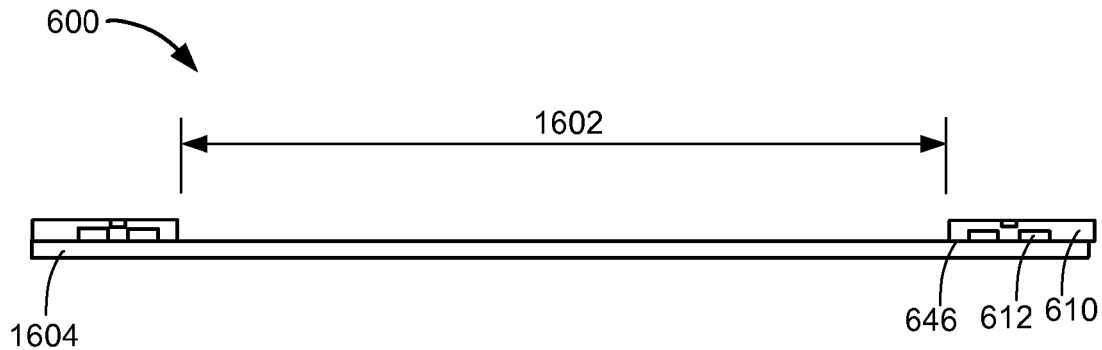
FIG. 16 is a cross-sectional view the multi-chip package system of FIG. 6 in a phase for mounting the outer carrier.

Referring now to FIG. 16, therein is shown a cross-sectional view the multi-chip package system 600 of FIG. 6 in a phase for mounting the outer carrier 610. The outer carrier 610 has an opening 1602 and attaches with a tape 1604, such as a coverlay tape. The tape 1604 covers the terminals 612 along the outer exposed side 646. The outer carrier 610 may serve multiple functions, such as a stiffener as well as a substrate. The outer carrier 610 may provide structural support securing the tape 1604 in a planar configuration.

Figure 17:
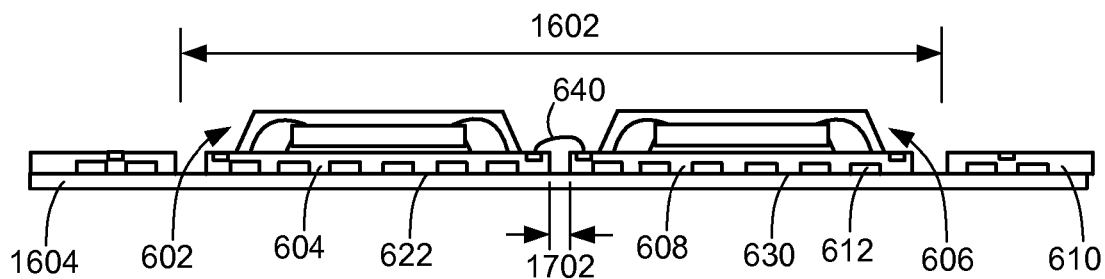
FIG. 17 is the structure of FIG. 16 in a phase for mounting the first integrated circuit package system and the second integrated circuit package system.

Referring now to FIG. 17, therein is shown the structure of FIG. 16 in a phase for mounting the first integrated circuit package system 602 and the second integrated circuit package system 606. The first integrated circuit package system 602 and the second integrated circuit package system 606 are mounted within the opening 1602 of the outer carrier 610 and on the tape 1604. The first exposed side 622 and the second exposed side 630 attach to the tape 1604. The tape 1604 covers the terminals 612 of the first carrier 604 and the second carrier 608 from further processing. The tape 1604 provides the planar rigidity such that the first exposed side 622 and the second exposed side 630 are coplanar. The first integrated circuit package system 602 and the second integrated circuit package system 606 are adjacent to each other with one of first spaces 1702 in between. The third interconnects 640 connect the first carrier 604 and the second carrier 608.

Figure 18:
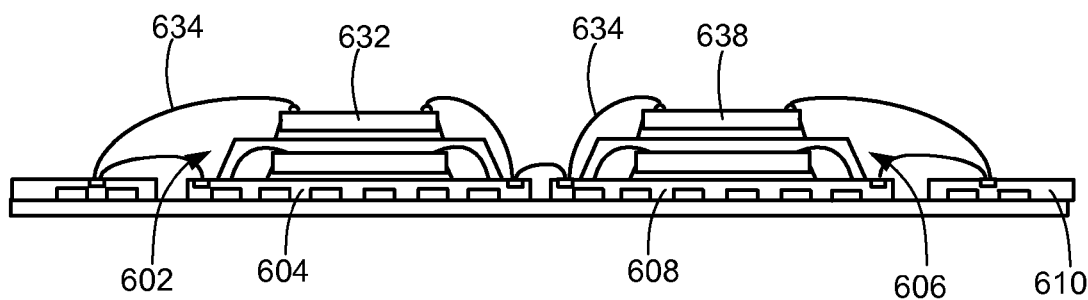
FIG. 18 is the structure of FIG. 17 in a phase for mounting the first device and the second device.

Referring now to FIG. 18, therein is shown the structure of FIG. 17 in a phase for mounting the first device 632 and the second device 638. The first device 632 mounts over the first integrated circuit package system 602. The second device 638 mounts over the second integrated circuit package system 606. The second interconnects 634 connect the first device 632 and the first carrier 604 as well as connect the second device 638 and the second carrier 608. The first device 632 and the second device 638 connect with the outer carrier 610 with the second interconnects 634.

Figure 19:
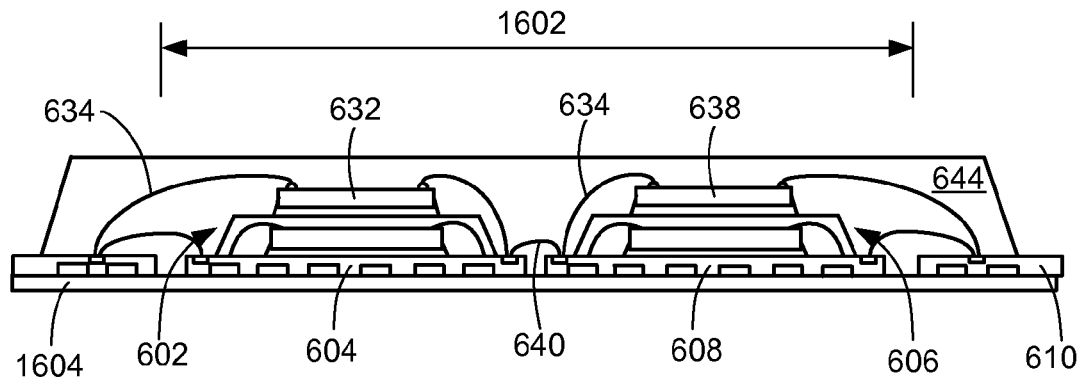
FIG. 19 is the structure of FIG. 18 in a phase for forming the package encapsulation.

Referring now to FIG. 19, therein is shown the structure of FIG. 18 in a phase for forming the package encapsulation 644. The package encapsulation 644 is formed covering a portion of the outer carrier 610 and filling the opening 1602. The package encapsulation 644 covers the first integrated circuit package system 602, the second integrated circuit package system 606, the second interconnects 634, the first device 632, the second device 638, and the third interconnects 640. The tape 1604 provides a planar surface such that the package encapsulation 644 in the opening 1602 is coplanar with the first carrier 604 and the second carrier 608.

Figure 20:
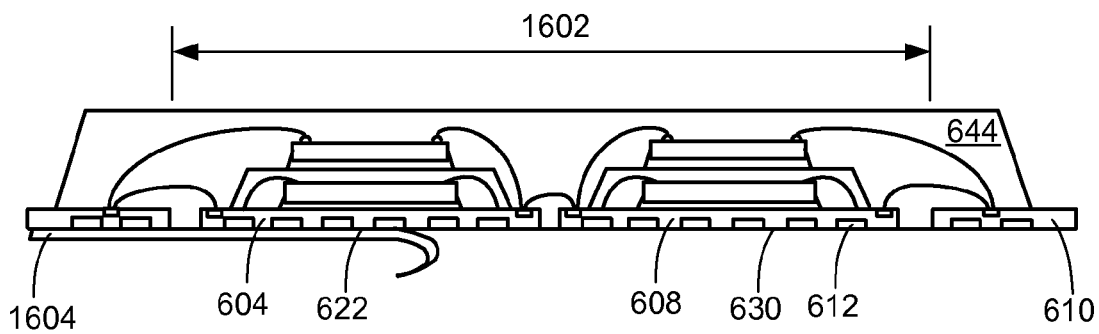
FIG. 20 is the structure of FIG. 19 in a phase for removing the tape.

Referring now to FIG. 20, therein is shown the structure of FIG. 19 in a phase for removing the tape 1604. The package encapsulation 644 may undergo post mold cure. The tape 1604 is removed from the outer carrier 610, the first carrier 604, and the second carrier 608 exposing the package encapsulation 644 in the opening 1602. The terminals 612 are also exposed. A surface of the package encapsulation 644 in the opening 1602, the first exposed side 622, and the second exposed side 630 are coplanar.

Figure 21:
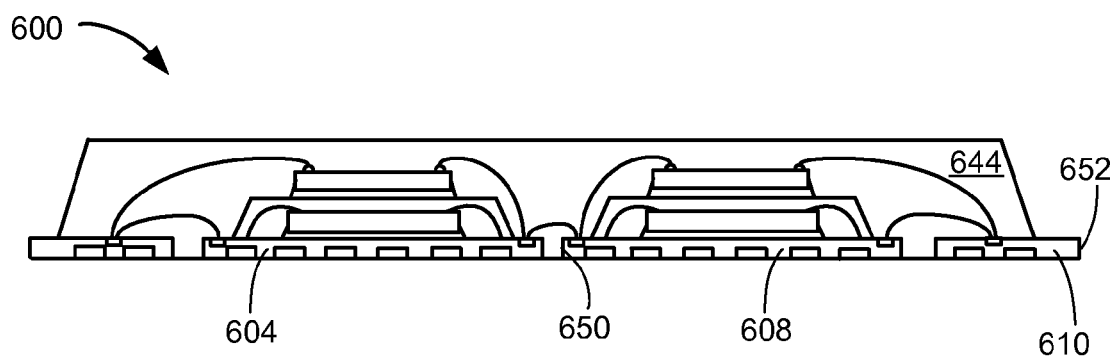
FIG. 21 is the structure of FIG. 20 in a phase for forming the multi-chip package system.

Referring now to FIG. 21, therein is shown the structure of FIG. 20 in a phase for forming the multi-chip package system 600. The multi-chip package system 600 may undergo end of line processing, such as laser marking or solder ball attaching. The multi-chip package system 600 may be singulated. The package encapsulation 644 covers the first edges 648 of the first carrier 604 and the second edges 650 of the second carrier 608. The package encapsulation 644 exposes the outer edges 652 of the outer carrier 610.

Figure 22:
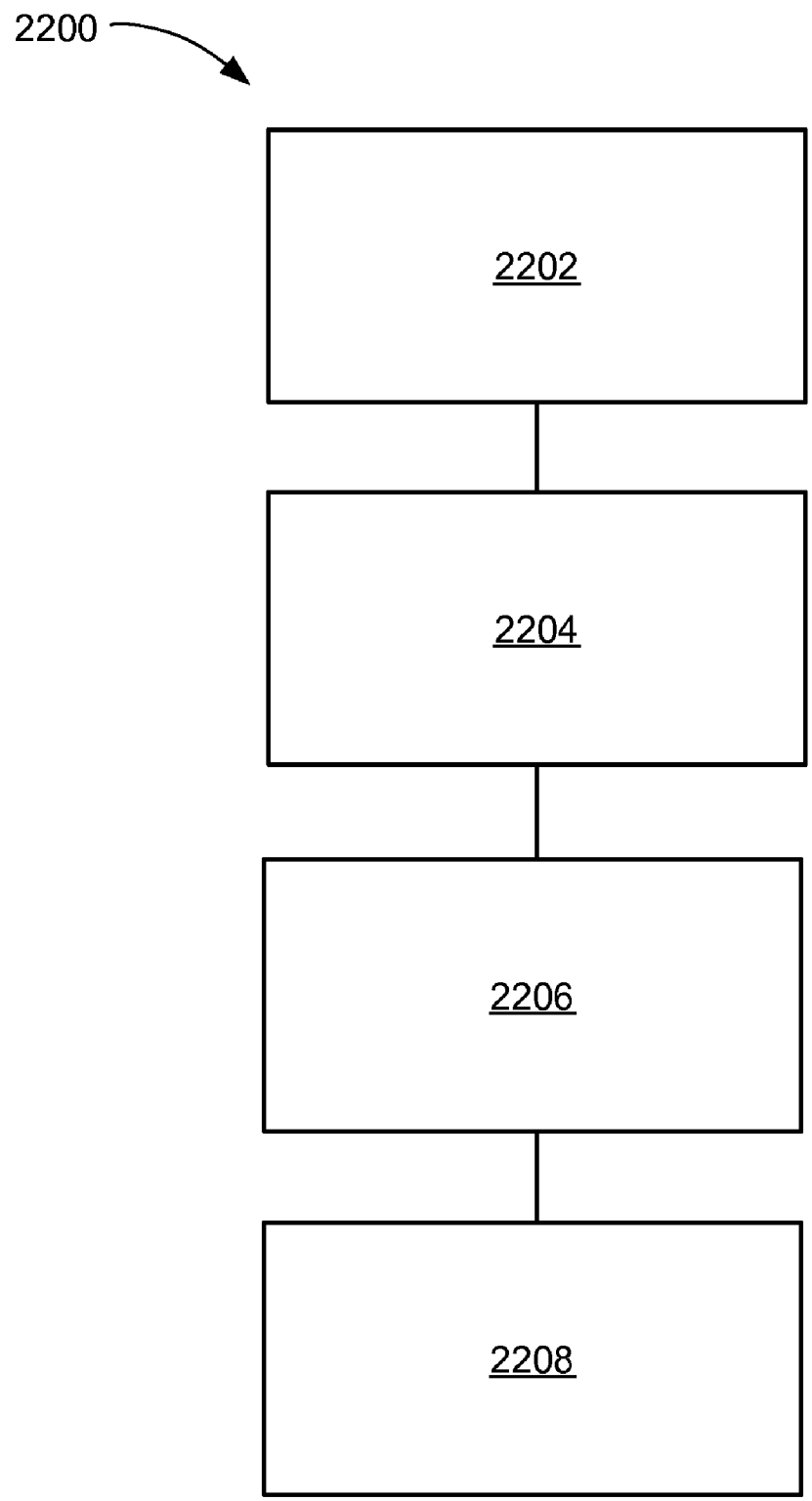
FIG. 22 is a flow chart of a multi-chip package system for manufacture of the multi-chip package system in an embodiment of the present invention.

Referring now to FIG. 22, therein is shown a flow chart of a multi-chip package system 2200 for manufacture of the multi-chip package system 100 in an embodiment of the present invention. The system 2200 includes providing a first carrier having a first integrated circuit die thereover in a block 2202; providing a second carrier in a block 2204; placing the first carrier coplanar with the second carrier in a block 2206; and molding a package encapsulation around and exposing the first carrier in a block 2208.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the multi-chip package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing multi-chip package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing for a multi-chip package system comprising:
   providing a first carrier having a first non-exposed side opposite a first exposed side with terminals thereon;
   attaching a first integrated circuit die to the first non-exposed side, the first integrated circuit die connected to the terminals through the first carrier;
   providing a second carrier;
   placing the first carrier coplanar with the second carrier; and
   molding a package encapsulation around and exposing the first carrier.

2. The method as claimed in claim 1 wherein:
   providing the first carrier having the first integrated circuit die includes:
      providing a first integrated circuit package system having the first integrated circuit die and the first carrier; and
   providing the second carrier also includes:
      providing a second integrated circuit package system having a second integrated circuit die and the second carrier.

3. The method as claimed in claim 1 further comprising mounting a device over the first integrated circuit die.

4. The method as claimed in claim 1 wherein molding the package encapsulation around the first carrier includes:
   covering a first edge of the first carrier and a second edge of the second carrier with the package encapsulation; and
   molding the package encapsulation over the first integrated circuit die.

5. The method as claimed in claim 1 wherein:
   providing the second carrier includes:
      providing an outer carrier having an opening; and
   placing the first carrier coplanar with the second carrier also includes:
      placing the first carrier in the opening coplanar with the outer carrier.

6. A method of manufacturing for a multi-chip package system comprising:
   providing a first integrated circuit package system having a first carrier including a first non-exposed side opposite a first exposed side with terminals thereon;
   attaching a first integrated circuit die to the first non-exposed side, the first integrated circuit die connected to the terminals through the first carrier;
   providing a second carrier;
   placing the first carrier coplanar with the second carrier;
   connecting the first carrier and the second carrier; and
   molding a package encapsulation around and exposing the first carrier.

7. The method as claimed in claim 6 wherein:
   providing the second carrier includes:
      providing a second integrated circuit package system having a second integrated circuit die and the second carrier; and
   further comprising:
      mounting a device over the first integrated circuit package system and the second integrated circuit package system.

8. The method as claimed in claim 6 further comprising:
   mounting a first device over the first integrated circuit package system; and
   mounting a second device over the second carrier.

9. The method as claimed in claim 6 wherein molding the package encapsulation around the first carrier and the second carrier includes covering the first integrated circuit package system with the package encapsulation.

10. The method as claimed in claim 6 further comprising:
    providing an outer carrier having an opening;
    connecting the outer carrier with the first carrier and the second carrier; and
    wherein placing the first carrier coplanar with the second carrier includes:
       placing the first carrier and the second carrier in the opening coplanar with the outer carrier.

11. A multi-chip package system comprising:
    a first carrier having a first non-exposed side opposite a first exposed side with terminals thereon;
    a first integrated circuit die attached to the first non-exposed side, the first integrated circuit die connected to the terminals through the first carrier;
    a second carrier coplanar with the first carrier; and
    a package encapsulation around and exposing the first carrier.

12. The system as claimed in claim 11 wherein:
    the first carrier having the first integrated circuit die includes:
       a first integrated circuit package system having the first integrated circuit die and the first carrier; and
    the second carrier having the second integrated circuit die also includes:
       a second integrated circuit package system having a second integrated circuit die and the second carrier.

13. The system as claimed in claim 11 further comprising mounting a device over the first integrated circuit die.

14. The system as claimed in claim 11 wherein the package encapsulation includes:
    the package encapsulation as a cover for a first edge of the first carrier and a second edge of the second carrier; and
    the package encapsulation over the first integrated circuit die.

15. The system as claimed in claim 11 wherein:
    the second carrier includes:
       an outer carrier having an opening; and
    the first carrier coplanar with the second carrier also includes:
       the first carrier in the opening is coplanar with the outer carrier.

16. The system as claimed in claim 11 wherein:
    the first carrier is part of a first integrated circuit package system having the first integrated circuit die;
    the second carrier is a substrate coplanar with the first carrier; and
    the package encapsulation is a cover around and exposing the first carrier.

17. The system as claimed in claim 16 further comprising:
a second integrated circuit package system having a second integrated circuit die and the second carrier; and
a device over the first integrated circuit package system and the second integrated circuit package system.

18. The system as claimed in claim 16 further comprising:
a first device over the first integrated circuit package system; and
a second device over the second carrier.

19. The system as claimed in claim 16 wherein the package encapsulation includes the package encapsulation over the first integrated circuit package system.

20. The system as claimed in claim 16 further comprising:
an outer carrier having an opening and connected with the first carrier and the second carrier; and
wherein the first carrier coplanar with the second carrier includes:
the first carrier and the second carrier in the opening coplanar with the outer carrier.

* * * * *